United States Patent

[11] 3,594,652

[72] Inventor Johannes L. Springer
Beaverton, Oreg.
[21] Appl. No. 813,944
[22] Filed Apr. 7, 1969
[45] Patented July 20, 1971
[73] Assignee Tektronix, Inc.
Beaverton, Oreg.

[54] LOW IMPEDANCE INPUT, VARIABLE ATTENUATION AMPLIFIER
5 Claims, 2 Drawing Figs.

[52] U.S. Cl. .......... 330/20, 330/30
[51] Int. Cl. .......... H03f 3/68
[50] Field of Search .......... 330/14, 15, 20, 30, 51, 119, 120, 157, 185

[56] References Cited
UNITED STATES PATENTS
3,304,507 2/1967 Weekes et al. .......... 330/51 X
3,360,739 12/1967 Cooke-Yarborough...... 330/20 X

*Primary Examiner*—John Kominski
*Assistant Examiner*—Lawrence J. Dahl
*Attorney*—Buckhorn, Blore, Klarquist and Sparkman

ABSTRACT: A variable attenuation amplifier includes a common base transistor stage and a common emitter transistor stage which are selectably connected to an input terminal. The common base state is employed to provide higher gain with low noise, while the common emitter stage is selected in the higher attenuation positions of the circuit.

PATENTED JUL 20 1971 3,594,652

JOHANNES L. SPRINGER
*INVENTOR*

*BY*

*BUCKHORN, BLORE, KLARQUIST & SPARKMAN*
*ATTORNEYS*

LOW IMPEDANCE INPUT, VARIABLE ATTENUATION AMPLIFIER

BACKGROUND OF THE INVENTION

A conventional attenuation circuit, as may be incorporated in measuring instruments and the like, is illustrated in FIG. 1. A variable attenuator 10 is provided with an input terminal 12 and drives an amplifier 14. In the case of a low-input impedance attenuator 10, the range of the attenuator is usually somewhat limited. At higher attenuation ratios, the attenuator 10 would become increasingly more critical to component stray parameters. This would result in an increasingly more complicated attenuator at higher attenuation ratios if a good frequency response were required.

For the type of amplifier 14 suitably employed in the FIG. 1 circuit, the amplification provided thereby is also limited. For instance, amplifier 14 suitably comprises a common emitter or grounded emitter transistor stage having its base input coupled to attenuator 10. In order to achieve the best frequency response in such a stage, the gain is designed to be quite low. Therefore, the maximum attenuation range of attenuator 10 is not easily extended by changing the gain of amplifier 14. A different amplifier, for instance one employing a common base or grounded base transistor stage, might provide greater gain, but the input impedance of such a stage is low enough to affect undesirably the operation of attenuator 14, and therefore such an amplifier is generally not driven by an attenuator.

SUMMARY OF THE INVENTION

According to the present invention, a low impedance input, variable attenuation amplifier circuit comprises selectable grounded base and grounded emitter transistor stages wherein a variable attenuator is employed in the input of the grounded emitter stage. The two stages drive a paraphase amplifier which provides the same polarity output for a given signal coupled via either the grounded base stage or the grounded emitter stage. The grounded base stage is used for the more sensitive positions of selected attenuation, while the grounded emitter stage is utilized for a considerably reduced range of attenuations, thereby providing an overall wide attenuating range. This wide attenuating range is achieved in an amplifier circuit characterized by excellent frequency response and low noise, and which exhibits a very low-input impedance.

It is therefore an object of the present invention to provide an improved variable attenuation system.

It is another object of the present invention to provide a variable attenuation amplifier having a low-input impedance.

It is another object of the present invention to provide an improved variable attenuation amplifier characterized by good frequency response and low noise.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figures 1, 2:
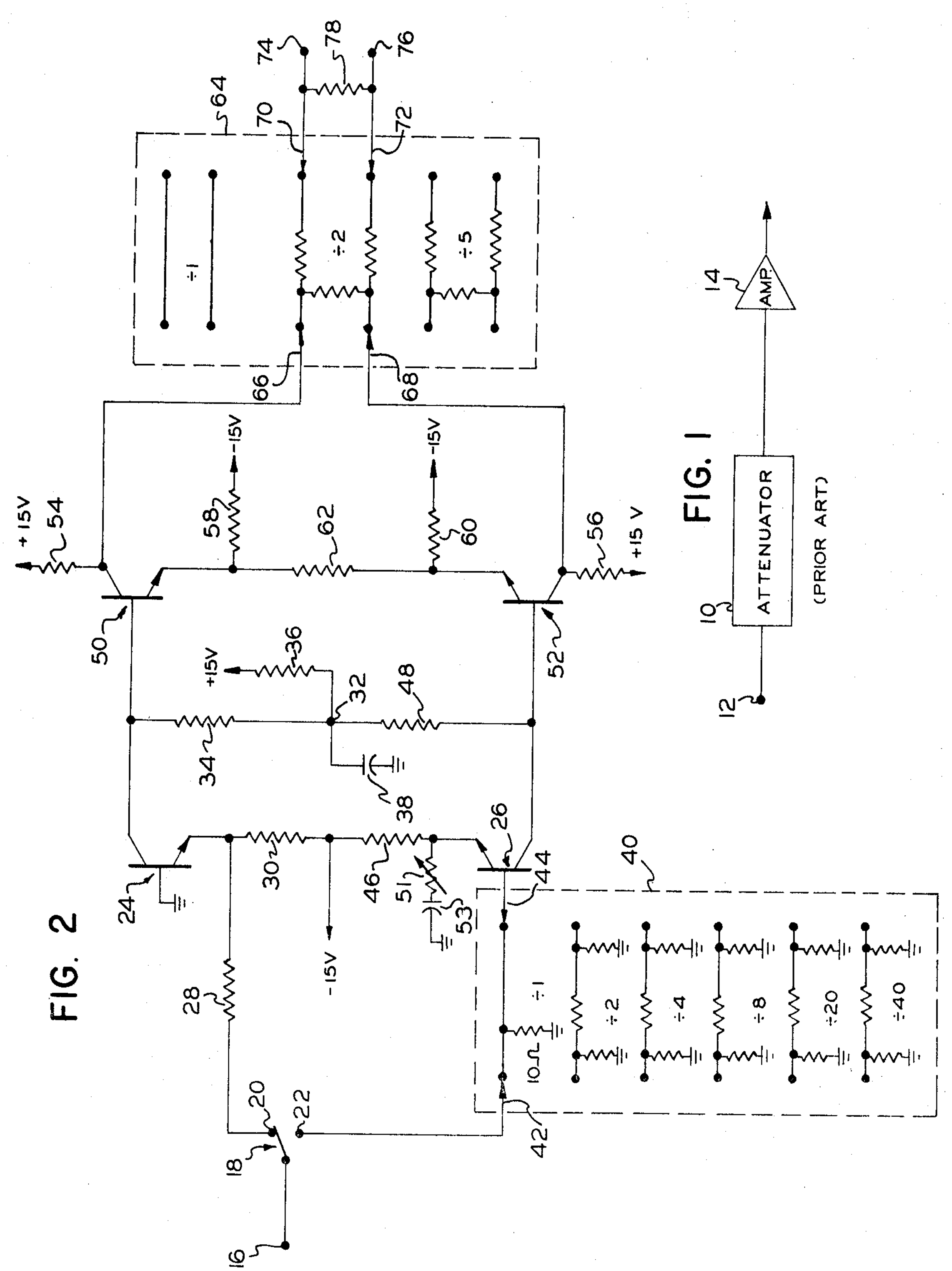
FIG. 1 is a block diagram of a prior art attenuating amplifier.
FIG. 2 is a schematic diagram of a low-impedance input, variable attenuation amplifier according to the present invention.

Referring to FIG. 1, a prior art variable attenuation circuit is illustrated including attenuator 10, receiving an input signal at terminal 12, and providing an attenuated output for amplifier 14. The amplifier 14 might conventionally comprise at least an input stage consisting of a grounded emitter transistor receiving the output of attenuator 10 at its base terminal. As hereinbefore mentioned, if a low-input impedance is desired at input terminal 12, the range of attenuation of attenuator 10 is somewhat limited because of complications incurred at high attenuation ratios.

Referring to FIG. 2, a variable attenuation amplifier in accordance with the present invention is illustrated. An input signal is received at input terminal 16 which is connected to the movable terminal of a switch 18. The alternative output terminals 20 and 22 of switch 18 are coupled respectively to a first amplifier including an NPN transistor 24 and a second amplifier including an NPN transistor 26. Transistor 24 has its base terminal grounded and its emitter terminal coupled to switch terminal 20 through a resistor 28 suitably having a value of approximately 7 ohms. Thus, transistor 24 is connected in the common base or grounded base configuration. The emitter of transistor 24 is also returned to a −15 v. via resistor 30, while its collector is connected to terminal 32 via load resistor 34. Terminal 32 is connected to +15 v. by means of resistor 36 and is bypassed to ground employing capacitor 38. Transistor 24 has a current gain of approximately one.

Switchable attenuator 40 couples switch terminal 22 to the base of transistor 26. Attenuator 40 comprises a number of sections designated 1, 2, 4, 8, 20, and 40. The input impedance of each of these attenuation sections is arranged to be 10 ohms. Thus, in the case of the 1 section, a parallel 10 ohms resistance is shunted from the signal line to ground. The successive sections are interposed in the circuit by means of movable switch terminals 42 and 44 which operate together for connecting the respective attenuator sections. The attenuator sections have resistance values adapted to provide the degree of attenuation indicated at switch terminal 44 with respect to switch terminal 42 when a respective section is included in the circuit. The sections beyond the 1 section each suitably comprise a pi network of resistances, and the calculation of appropriate values therefor is well understood by those skilled in the art.

Since transistor 26 receives its input at its base terminal, the transistor is recognized as being connected in a common emitter or grounded emitter configuration. The collector of transistor 26 is returned to terminal 32 through load resistor 48. The emitter of transistor 26 is returned to −15 volts by resistor 46. Also, a series circuit comprising resistor 51 and capacitor 53 is interposed between the emitter of transistor 26 and ground. Resistor 51 is variable and is employed for setting the gain of the amplifier comprising transistor 26 such that the voltage gain of this stage is approximately two. The common emitter transistor provides good high frequency response at a low-gain value such as this. The circuit comprising resistor 51 and capacitor 53 provides a low-impedance emitter load at desired operating frequencies.

It will be recognized that a phase inversion exists across transistor 26 while no phase inversion exists in the case of transistor 24. However, each of these transistors selectively receives the input signal, according to the setting of switch 18, and it is desired that no change in output phase occur with the change in the setting of switch 18. It is also desirable in many instances, e.g. in providing a drive for the deflection apparatus of an oscilloscope, to deliver a push-pull output signal. In the present circuit, the collector of transistor 24 is connected to the base of an NPN transistor 50 while the collector of transistor 26 is connected to the base of an NPN transistor 52. The collector of transistor 50 is returned to +15 v. through load resistor 54, and the collector of transistor 52 is coupled to +15 volts by means of load resistor 56. The emitters of transistors 50 and 52 are returned to −15 volts by resistors 58 and 60 while a resistor 62 is interposed between the two emitters.

Transistors 50 and 52 comprise a paraphase amplifier circuit wherein an input of a first polarity at the base of transistor 50 produces a given polarity of output at the collector of transistor 50. Thus a positive-going input at the base of transistor 50 results in a negative-going output across resistor 54. At the same time, as a result of the coupling circuit between the emitters comprising resistors 58, 60, and 62, a similar but positive-going output is developed across resistor 56. Thus, a signal delivered from the collector of transistor 24 results in the production of a push-pull output. However, an output from the collector of transistor 26 also results in a push-pull output. This time, a negative-going signal at the base of transistor 52 produces the same push-pull outputs described above.

The intercoupling between the emitters of transistors 50 and 52 is basically provided by the unbypassed resistors 58 and 60 as understood by those skilled in the art. Resistor 62 is a gain setting resistor and also enhances the high frequency response of the circuit.

Push-pull output of the paraphase amplifier comprising transistors 50 and 52 is applied to a gain switching circuit 64. This gain switching circuit is also an attenuator similar to attenuator 40, and is provided with a 1 section, a 2 section, and a 5 section, so designated on the drawing. Switching means 66, 68 connected respectively to the collectors of transistors 50, 52 cooperate with switching means 70 and 72 to serially include one of the attenuation sections of the gain switching circuit 64 between the paraphase amplifier and a pair of output terminals 74 and 76. The 1 attenuator section comprises two connections which would be disposed directly between switching means 66 and 70 and also between switching means 68 and 72. Each of the other attenuator sections comprises a resistor in each line and an additional resistor across the input terminals of the section to provide the attenuation designated. The calculation of appropriate resistance values to provide the attenuation indicated is well understood by those skilled in the art. In addition, an output resistor 78 is permanently connected between output terminals 74 and 76.

Considering operation of the circuit, the present circuit is adapted to exhibit a very low-input impedance, of about ten ohms, for example, while providing a variably attenuated drive for an instrument such as an oscilloscope or the like. As hereinbefore indicated, it has been difficult employing prior circuits to provide a wide degree of attenuation for a signal at this initial impedance level. According to the present invention, the switch 18 is thrown to its upper position, that is connecting input terminal 16 to switch terminal 20 for the most sensitive setting of the circuit. While the resistor 28 causes the total input impedance to approximate ten ohms, in the particular embodiment, resistor 34 has a value of 100 ohms, and the grounded base amplifier comprising transistor 24 transfers the impedance from 10 ohms to 100 ohms. A low noise signal of 100 millivolts per milliampere of input current is developed across resistor 34. A voltage gain of ten is then provided. This voltage across resistor 34 is applied to the paraphase amplifier comprising transistors 50 and 52 for supplying a push-pull output. Three attenuation steps are then controlled by the gain switching circuit 64.

For remaining attenuation positions, the switch 18 connects the input signal from terminal 16 via attenuator 40 to the common emitter stage comprising transistor 26, the latter having a voltage gain of two. The input impedance of attenuator 40 is 10 ohms, and the output impedance of the attenuator is low compared with the input impedance of the common emitter transistor circuit. Therefore, the parameters of transistor 26 have virtually no effect on the accuracy of the attenuator. With the attenuator 40 in the 1 position, the voltage developed across resistor 48, which also has a value of 100 ohms, is 20 millivolts per milliampere of input current. This voltage is also applied to the paraphase amplifier consisting of transistors 50 and 52. It is noted that this signal is one-fifth the value developed and applied when switch 18 was in its upper position.

The output signal phase provided by the paraphase amplifier is the same for either position of switch 28 despite the difference in phase shift across transistors 24 and 26. Thus the connection of the collector of transistor 24 to the base of transistor 50 provides the same polarity of output as the opposite polarity signal from the collector of transistor 26 applied at the base of transistor 52.

For successively larger degrees of attenuation, switch terminals 42 and 44 are connected to insert other attenuation sections from attenuator 40 between switch terminal 22 and the base of transistor 26. By selection of the attenuating section from attenuator 40 and also by selection of the attenuator section from gain switching circuit 64, it is possible to provide an attenuation of from 10 to 1000 in steps including 10, 20, 50, 100, 200, 500, and 1,000. Of course, when switch 18 is in its upper position, attenuations of 1, 2, and 5 are secured by selecting the attenuating section from gain switching circuit 64. In practice, switching means 18, 42, 44, 66, 68, 72, and 74 are ganged to operate simultaneously for selecting desired degrees of attenuation.

With the circuit according to the present invention, a wide range of attenuation is provided from positions of high sensitivity to positions providing a large degree of comparative attenuation, while at the same time developing a low-noise output signal with low distortion. That is, the amplifier circuit according to the present invention is wide band, the circuit having the frequency response required in a testing instrument or the like for producing an output accurately representative of the input signal. The wide range of attenuation is accomplished with an attenuator 40 having a maximum attenuation ratio of only 40. The maximum attenuation ratio is reduced by a factor of five from what would be required in the prior art circuit configuration of FIG. 1, making the amplifier much less critical to component stray parameters and providing a much better overall frequency response. The addition of the grounded base stage comprising transistor 24 for accomplishing higher amplification in the higher sensitivity positions, enables the use of the attenuator 40 having the lower maximum attenuation ratio.

It is important to note that the attenuator of the type employed at 40 would not be suitably employed between switch 18 and transistor 24, for example. In such a case, the attenuation selected would be too much affected by the changing characteristics of transistor 24. Therefore, grounded base transistor 24 is suitably employed only for the more sensitive positions, while transistor 26, arranged to have a lower gain and not affecting the operation of attenuator 40, cooperates in the higher attenuation positions. Both are adapted to provide the same push-pull output polarity inasmuch as transistors 24 and 26 drive the paraphase amplifier comprising transistors 50 and 52 in opposite directions.

The term attenuation as used herein is relative, e.g. with respect to the most sensitive switching position of the circuit. Thus in the more sensitive switching positions, amplification is involved.

While I have shown and described a preferred embodiment of my invention, it will be apparent to those skilled in the art that many changes and modifications may be made without departing from my invention in its broader aspects.

I claim:

1. A variable attenuation amplifier comprising:
a first transistor amplifier employing a common base configuration,
a second transistor amplifier employing a common emitter configuration,
an input terminal, and means for selectively coupling said input terminal to the input of said first amplifier or the input of said second amplifier,
attenuation means between said switching means and said second amplifier, and
means coupled to the output of both said first amplifier and second amplifier for providing an output signal.

2. The amplifier according to claim 1 wherein said means coupled to the output of said first amplifier and second amplifier comprises a paraphase amplifier for receiving oppositely phased signals from said first amplifier and said second amplifier and producing a common push-pull output in response thereto.

3. The amplifier according to claim 2 further including output terminals and gain switching means interposed between said paraphase amplifier and said output terminals.

4. The amplifier according to claim 1 wherein the attenuation of said attenuation means is variable.

5. An amplifier circuit comprising:

an input terminal, a first transistor amplifier comprising a first transistor disposed in a common base configuration, a second transistor amplifier comprising a second transistor disposed in a common emitter configuration, switching means for alternatively coupling said input terminal to the emitter of said first transistor and the base of said second transistor, adjustable attenuation means interposed between said switching means and the base of said second transistor, a paraphase amplifier for receiving the outputs of the first and second amplifiers and producing a common polarity output in response thereto, and a variable attenuation gain switching means coupled to the output of said paraphase amplifier.

UNITED STATES PATENT OFFICE
CERTIFICATE OF CORRECTION

Patent No. 3,594,652 Dated July 20, 1971

Inventor(s) JOHANNES L. SPRINGER

It is certified that error appears in the above-identified patent and that said Letters Patent are hereby corrected as shown below:

Abstract, line 4, "state" should be --stage--

Col. 2, line 25, "1, 2, 4, 8, 20, and 40" should be -- ÷1, ÷2, ÷4, ÷8, ÷20, and ÷40 --

Col. 2, line 27, "1 section" should be -- ÷1 section --

Col. 2, line 35, "1 section" should be -- ÷1 section --

Col. 3, lines 19-20, "a 1 section, a 2 section, and a 5 section" should be -- a ÷1 section, a ÷2 section, and a ÷5 section --

Col. 3, line 25, "1 attenuator" should be -- ÷1 attenuator --

Col. 3, line 63, "1 position" should be -- ÷1 position --

Col. 3, line 71, "switch 28" should be -- switch 18 --

Signed and sealed this 16th day of May 1972.

(SEAL)
Attest:

EDWARD M.FLETCHER,JR.
Attesting Officer

ROBERT GOTTSCHALK
Commissioner of Patents